United States Patent
Sa et al.

(10) Patent No.: US 10,777,458 B2
(45) Date of Patent: Sep. 15, 2020

(54) METHOD OF FILLING A VIA HOLE AND APPARATUS FOR PERFORMING THE SAME

(71) Applicant: SEMES CO., LTD., Cheonan-si, Chungcheongnam-do (KR)

(72) Inventors: Yoon Ki Sa, Seoul (KR); Mong Ryong Lee, Suwon-si (KR)

(73) Assignee: SEMES CO., LTD., Cheonan-si, Chungcheongnam-Do (KR)

( * ) Notice: Subject to any disclaimer, the term of this patent is extended or adjusted under 35 U.S.C. 154(b) by 10 days.

(21) Appl. No.: 15/841,518

(22) Filed: Dec. 14, 2017

(65) Prior Publication Data

US 2018/0182669 A1 Jun. 28, 2018

(30) Foreign Application Priority Data

Dec. 27, 2016 (KR) .................. 10-2016-0180171
Feb. 28, 2017 (KR) .................. 10-2017-0025833

(51) Int. Cl.
*H01L 21/768* (2006.01)
*C25D 13/12* (2006.01)
*H01L 23/48* (2006.01)
*H01L 21/288* (2006.01)

(52) U.S. Cl.
CPC ........ *H01L 21/76898* (2013.01); *C25D 13/12* (2013.01); *H01L 21/2885* (2013.01); *H01L 23/481* (2013.01)

(58) Field of Classification Search
CPC ........... H01L 21/76898; H01L 21/2885; H01L 23/481; C25D 13/12
See application file for complete search history.

(56) References Cited

U.S. PATENT DOCUMENTS

| 6,229,702 | B1 * | 5/2001 | Tao | H01L 23/3675 165/80.2 |
| 9,159,606 | B1 * | 10/2015 | Purayath | H01L 21/7682 |
| 9,620,264 | B2 * | 4/2017 | Ding | G06F 3/041 |
| 2004/0205402 | A1 * | 10/2004 | Yamaguchi | G01R 31/2886 714/30 |
| 2015/0322589 | A1 * | 11/2015 | Busnaina | H01L 21/76879 204/477 |
| 2019/0037703 | A1 * | 1/2019 | Wang | H05K 3/4644 |

FOREIGN PATENT DOCUMENTS

| CN | 103337300 B | * | 12/2014 | ............. G06F 3/041 |
| KR | 20150006213 A | * | 1/2015 | |
| KR | 20180076266 A | * | 7/2018 | |

* cited by examiner

*Primary Examiner* — Edward Chin
(74) *Attorney, Agent, or Firm* — Kile Park Reed & Houtteman PLLC

(57) ABSTRACT

A method of filling a via hole and an apparatus for performing the same are disclosed. The method includes providing a filling material having a fluidity on a via hole formed in the substrate, forming an electric field through the substrate to fill the via hole with the filling material, and solidifying the filling material in the via hole. The apparatus includes a stage for supporting the substrate, upper and lower electrodes for forming the electric field, and a power supply connected with the upper and lower electrodes.

5 Claims, 6 Drawing Sheets

METHOD OF FILLING A VIA HOLE AND APPARATUS FOR PERFORMING THE SAME

CROSS-REFERENCE TO RELATED APPLICATION

This application claims the priority benefit of Korean Patent Application Nos. 10-2016-0180171 filed on Dec. 27, 2016 and 10-2017-0025833 filed on Feb. 28, 2017, and all the benefits accruing therefrom under 35 U.S.C. § 119, the contents of which are incorporated by reference in their entirety.

BACKGROUND

The present disclosure relates to a method of filling a via hole and an apparatus for performing the same. More specifically, the present disclosure relates to a method of filling a via hole formed in a substrate with a filling material by using an electric field and an apparatus for performing the same.

In general, semiconductor devices may be formed on a silicon wafer used as a semiconductor substrate by repeatedly performing a series of manufacturing processes, and the semiconductor devices formed as described above may be formed into semiconductor packages through a dicing process, a bonding process, and a packaging process.

Recently, 3D package technology for stacking semiconductor devices three-dimensionally has been attracting attention as the degree of integration of semiconductor devices has reached a physical limit. Particularly, a technology for commercializing a three-dimensional integrated circuit using a through silicon via (TSV) has been actively researched and developed. The TSV process technology can be classified into a via-first process for performing via hole formation and filling before the front end process, and a via-last process for performing via hole formation and filling after the front end process.

In the via-first process, via holes may be filled with polysilicon through a chemical vapor deposition process. However, since the polysilicon has a relatively high electrical resistance, device characteristics may be deteriorated. In the via-last process, via holes may be filled with copper through an electrolytic plating process. However, it is difficult to uniformly form a copper seed layer, and thus voids may be generated in the TSV electrodes. Further, it is difficult to determine the optimum condition of the electrolytic plating process.

SUMMARY

The present disclosure provides a new method of filling a via hole and an apparatus suitable for performing the same, which can solve the problems of the prior art as described above.

In accordance with an aspect of the present disclosure, a method of filling a via hole may include providing a filling material having a fluidity on a via hole formed in the substrate, forming an electric field through the substrate to fill the via hole with the filling material, and solidifying the filling material in the via hole.

In accordance with some exemplary embodiments of the present disclosure, the providing the filling material may include providing a cream solder on the via hole and melting the cream solder.

In accordance with some exemplary embodiments of the present disclosure, the filling material may include a solder paste having a predetermined viscosity.

In accordance with some exemplary embodiments of the present disclosure, the method may further include heating the filling material to remove a solvent and to melt a solder material after the filling material is filled in the via hole.

In accordance with some exemplary embodiments of the present disclosure, the filling material may be provided by a screen printing process, a stencil printing process, an inkjet printing process, or a dispensing process.

In accordance with some exemplary embodiments of the present disclosure, the forming the electric field may include applying an AC voltage to upper and lower electrodes disposed on upper and lower sides of the substrate, respectively.

In accordance with some exemplary embodiments of the present disclosure, the upper and lower electrodes may be disposed such that a distance between the upper electrode and the substrate is equal to a distance between the substrate and the lower electrode.

In accordance with some exemplary embodiments of the present disclosure, the forming the electric field may include applying a DC voltage to upper and lower electrodes disposed on upper and lower sides of the substrate, respectively, so that the filling material is moved into the via hole.

In accordance with some exemplary embodiments of the present disclosure, the forming the electric field may further include applying an AC voltage to the upper and lower electrodes so that the filling material is aligned in the via hole.

In accordance with another aspect of the present disclosure, an apparatus for filling a via hole may include a stage for supporting a substrate in which a via hole is formed, an upper electrode disposed on an upper side of the stage, a lower electrode disposed on a lower side of the stage, and a power supply connected with the upper and lower electrodes to form an electric field through the substrate, wherein a filling material, which is provided on the via hole and has a fluidity, may be filled in the via hole by the electric field.

In accordance with some exemplary embodiments of the present disclosure, the stage may have a ring shape to support an edge portion of the substrate.

In accordance with some exemplary embodiments of the present disclosure, the stage may have a mesh shape such that a portion where the via hole is formed is exposed downward.

In accordance with some exemplary embodiments of the present disclosure, the stage may be made of a porous ceramic material.

In accordance with some exemplary embodiments of the present disclosure, the apparatus may further include a heater for melting the filling material.

In accordance with some exemplary embodiments of the present disclosure, the power supply may apply an AC voltage to the upper and lower electrodes.

In accordance with some exemplary embodiments of the present disclosure, the power supply may apply a DC voltage to the upper and lower electrodes so that the filling material is moved into the via hole, and then apply an AC voltage to the upper and lower electrodes so that the filling material is aligned in the via hole.

In accordance with some exemplary embodiments of the present disclosure, a distance between the upper electrode and the substrate may be equal to a distance between the substrate and the lower electrode.

The above summary of the present disclosure is not intended to describe each illustrated embodiment or every implementation of the present disclosure. The detailed description and claims that follow more particularly exemplify these embodiments.

BRIEF DESCRIPTION OF THE DRAWINGS

Exemplary embodiments can be understood in more detail from the following description taken in conjunction with the accompanying drawings, in which.

Figure 1:
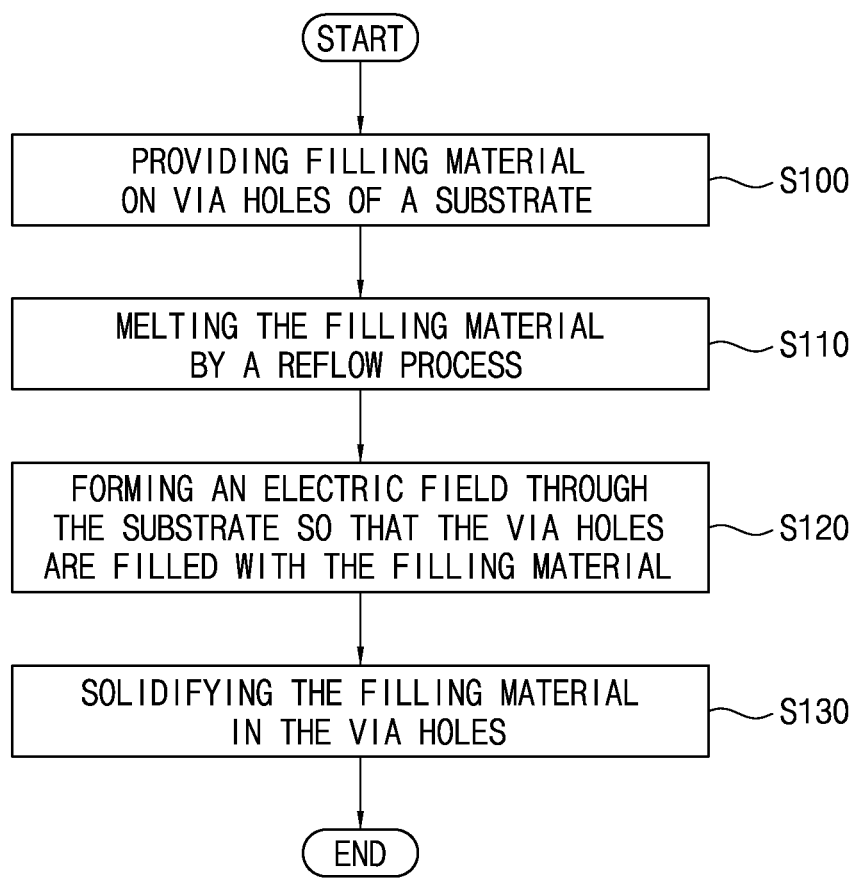
FIG. 1 is a flowchart illustrating a method of filling a via hole in accordance with an exemplary embodiment of the present disclosure.

While various embodiments are amenable to various modifications and alternative forms, specifics thereof have been shown by way of example in the drawings and will be described in detail. It should be understood, however, that the intention is not to limit the claimed inventions to the particular embodiments described. On the contrary, the intention is to cover all modifications, equivalents, and alternatives falling within the spirit and scope of the subject matter as defined by the claims.

DETAILED DESCRIPTION

Hereinafter, embodiments of the present invention are described in more detail with reference to the accompanying drawings. However, the present invention is not limited to the embodiments described below and is implemented in various other forms. Embodiments below are not provided to fully complete the present invention but rather are provided to fully convey the range of the present invention to those skilled in the art.

In the specification, when one component is referred to as being on or connected to another component or layer, it can be directly on or connected to the other component or layer, or an intervening component or layer may also be present. Unlike this, it will be understood that when one component is referred to as directly being on or directly connected to another component or layer, it means that no intervening component is present. Also, though terms like a first, a second, and a third are used to describe various regions and layers in various embodiments of the present invention, the regions and the layers are not limited to these terms.

Terminologies used below are used to merely describe specific embodiments, but do not limit the present invention. Additionally, unless otherwise defined here, all the terms including technical or scientific terms, may have the same meaning that is generally understood by those skilled in the art.

Embodiments of the present invention are described with reference to schematic drawings of ideal embodiments. Accordingly, changes in manufacturing methods and/or allowable errors may be expected from the forms of the drawings. Accordingly, embodiments of the present invention are not described being limited to the specific forms or areas in the drawings, and include the deviations of the forms. The areas may be entirely schematic, and their forms may not describe or depict accurate forms or structures in any given area, and are not intended to limit the scope of the present invention.

Figure 2:
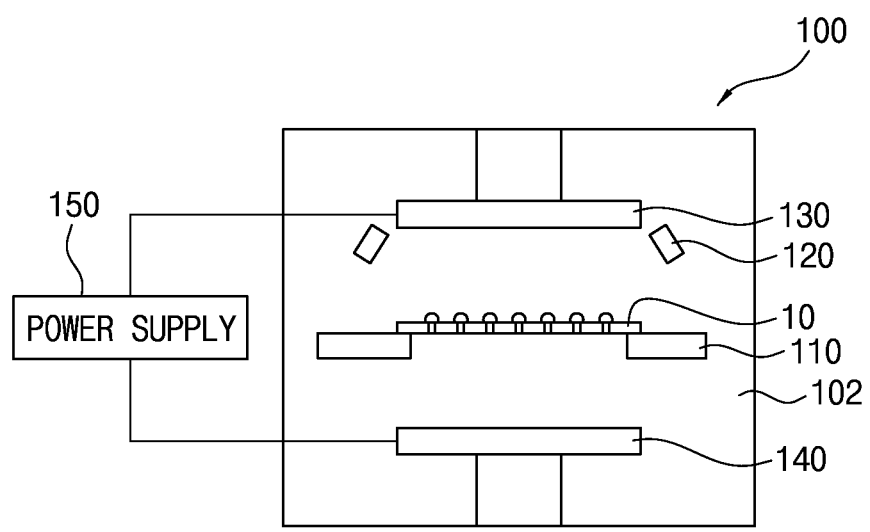
FIG. 2 is a schematic view illustrating an apparatus suitable for performing the via hole filling method as shown in FIG. 1.

FIG. 1 is a flowchart illustrating a method of filling a via hole in accordance with an exemplary embodiment of the present disclosure, and FIG. 2 is a schematic view illustrating an apparatus suitable for performing the via hole filling method as shown in FIG. 1.

Figure 3:
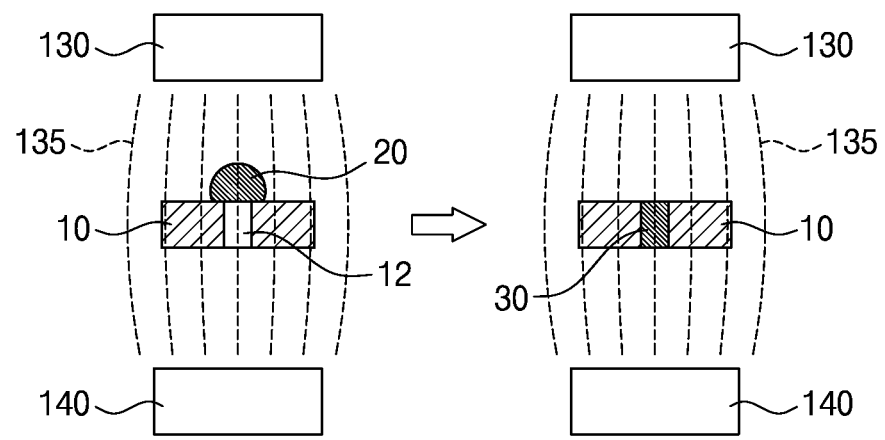
FIG. 3 is a schematic view illustrating the via hole filling method as shown in FIG. 1.

Referring to FIGS. 1 and 2, a method of filling a via hole, in accordance with an exemplary embodiment of the present disclosure, may be used to form TSV electrodes 30 (refer to FIG. 3) by filling via holes 12 (refer to FIG. 3) formed in a substrate 10 with a filling material 20 (refer to FIG. 3). The via holes 12 may be formed by a deep reactive ion etch (DRIE) process and may be filled with a filling material 20 such as a melted solder and a solder paste. Particularly, the via holes 12 may be exposed rearward by a back grinding process, and thus the substrate 10 may be penetrated by the via holes 12 as shown in figures.

In accordance with an exemplary embodiment of the present disclosure, an apparatus 100 for filling the via hole 12 may include a process chamber 102 in which a via hole filling process is performed, and a stage 110 disposed in the process chamber 102 to support the substrate 10 in which the via holes 12 are formed. The stage 110 may support an edge portion of the substrate 10 such that the via holes 12 are exposed downward.

For example, the substrate 10 may be a semiconductor die on which a semiconductor integrated circuit is formed, and the stage 110 may have a rectangular ring shape to support an edge portion of the semiconductor die. In such case, the semiconductor die may be transferred into the process chamber 102 after being individualized from a wafer by a dicing process.

Further, the substrate 10 may be a wafer on which semiconductor dies are formed. In such case, the stage 110 may have a circular ring shape to support an edge portion of the wafer or a plate shape having an opening such that a lower surface of the wafer is exposed downward.

The filling material 20 may be provided on the via holes 12. For example, a cream solder including a conductive material, such as copper (Cu), tin (Sn), silver (Ag), and the like, may be provided on the via holes 12 by a screen printing process or a stencil printing process. The cream solder provided on the via holes 12 may be melted by a reflow process.

The cream solder provided on the via holes 12 may be melted by a heater 120 disposed in the process chamber 102. For example, an infrared heater 120 for melting the cream solder may be disposed in the process chamber 102.

Alternatively, a solder paste, which has a predetermined viscosity so as to be flowable at room temperature, may be provided on the via holes 12. The solder paste may be provided on the via holes 12 by a screen printing process, a stencil printing process, an inkjet printing process, or a dispensing process, and may include a conductive material, such as copper (Cu), tin (Sn), silver (Ag), and the like. For example, a water-soluble solder paste may be used. However, the solder paste is not limited to water-soluble, and a water-insoluble, e.g., inorganic, organic, or rosin-based solder paste may be used as well.

Though not shown in figures, the apparatus 100 may include a screen printing module, a stencil printing module, an inkjet printing module, or a dispensing module to providing the filling material 20 onto the substrate 10. Particularly, the substrate 10 may be transferred into the process chamber 102 after the filling material 20 is provided onto the substrate 10.

The filling material 20 provided on the via holes 12 may be introduced into the via holes 12 by an electric field. For example, upper and lower electrodes 130 and 140 for forming an electric field 135 (refer to FIG. 3) may be disposed on upper and lower sides of the substrate 10, respectively. The filling material 20 may be moved into the via holes 12 by an electromotive force generated by the electric field 135 between the upper and lower electrodes 130 and 140.

In accordance with an exemplary embodiment of the present disclosure, an alternating current (AC) voltage may be applied to the upper and lower electrodes 130 and 140, and thus the electromotive force may be alternately applied to the filling material 20 in a vertical direction. That is, the filling material 20 may be vibrated in the vertical direction by the electromotive force, and may be moved into the via holes 12 by the vibration due to the electromotive force and the capillary phenomenon generated in the via holes 12.

Alternatively, a direct current (DC) voltage may be applied to the upper and lower electrodes 130 and 140 so that the filling material 20 is moved into the via holes 12. Then, an AC voltage may be applied to the upper and lower electrodes 130 and 140 so that the filling material 20 is aligned in the via holes 12.

Particularly, the upper and lower electrodes 130 and 140 may be disposed such that a distance between the upper electrode 130 and the substrate 10 is equal to a distance between the substrate 10 and the lower electrode 140. As a result, each filling material 20 may be aligned with a center of each via hole 12 by the alternating electromotive force generated between the upper and lower electrodes 130 and 140.

The apparatus 100 may include a power supply 150 connected with the upper and lower electrodes 130 and 140 to apply the DC voltage and the AC voltage to the upper and lower electrodes 130 and 140, and a controller (not shown) for controlling operations of the power supply 150.

FIG. 3 is a schematic view illustrating the via hole filling method as shown in FIG. 1.

Referring to FIGS. 1 to 3, in step S100, a conductive filling material 20 may be provided on via holes 12 formed in a substrate 10. In step S110, the filling material 20 may be melted by a reflow process so that the filling material 20 has fluidity. For example, a cream solder may be provided onto the via holes 12 by a screen printing process or a stencil printing process, and may then be melted by a heater 120 disposed in a process chamber 102.

In step S120, an electric field may be formed through the substrate 10 so that the via holes 12 are filled with the melted filling material 20. For example, an AC voltage may be applied to upper and lower electrodes 130 and 140 disposed on upper and lower sides of the substrate 10, respectively, and thus an electromotive force may be alternately applied to the melted filling material 20 in a vertical direction. The melted filling material 20 may be moved into the via holes 12 by the alternating electromotive force and the capillary action.

Alternatively, a direct current (DC) voltage may be applied to the upper and lower electrodes 130 and 140 so that the melted filling material 20 is moved into the via holes 12. Then, an AC voltage may be applied to the upper and lower electrodes 130 and 140 so that the melted filling material 20 is aligned in the via holes 12. In such case, a frequency of the AC voltage may be gradually increased from several Hz to several kHz so that the melted filling material 20 is aligned in the via holes 12.

Meanwhile, the DC voltage and the AC voltage may be applied to the upper and lower electrodes 130 and 140 by a power supply 150, and operations of the power supply 150 may be controlled by a controller (not shown).

In step S130, after the melted filling material 20 is filled in the via holes 12, the melted filling material 20 may be solidified in a natural cooling manner so that TSV electrodes 30 may be formed in the via holes 12.

Figure 4:
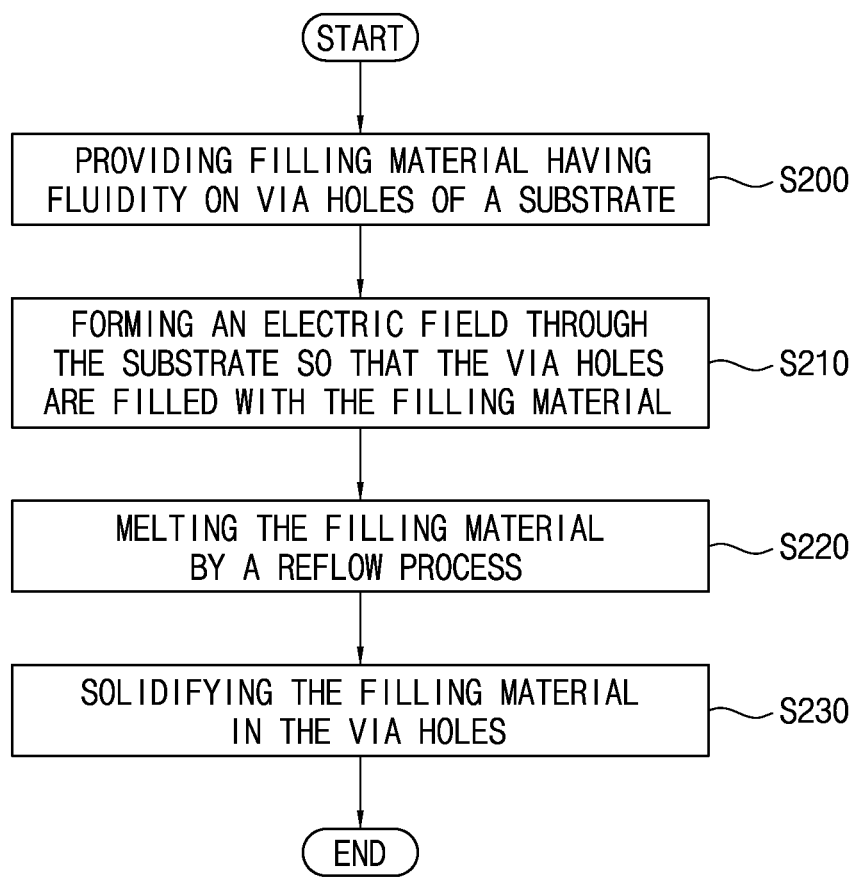
FIG. 4 is a flowchart illustrating a method of filling a via hole in accordance with another exemplary embodiment of the present disclosure.

FIG. 4 is a flowchart illustrating a method of filling a via hole in accordance with another exemplary embodiment of the present disclosure.

Referring to FIG. 4, in step S200, a filling material 20 having fluidity may be provided on via holes 12 formed in a substrate 10. For example, a solder paste having a predetermined viscosity at room temperature may be provided on the via holes 12 by a screen printing process, a stencil printing process, an inkjet printing process, or a dispensing process.

In step S210, an electric field may be formed through the substrate 10 so that the via holes 12 are filled with the filling material 20. For example, an AC voltage may be applied to upper and lower electrodes 130 and 140, and the filling material 20 may thus be moved into the via holes 12. Alternatively, a DC voltage may be applied to the upper and lower electrodes 130 and 140, and then an AC voltage may be applied to the upper and lower electrodes 130 and 140.

In step S220, a reflow process may be performed to melt the filling material 20. For example, the filling material 20 may be heated to a reflow temperature by a heater 120 disposed in a process chamber 102 such that a solvent in the filling material 20 is removed and a solder material in the filling material 20 is melted.

In step S230, the melted filling material 20 in the via holes 12 may be solidified in a natural cooling manner so that TSV electrodes 30 may be formed in the via holes 12.

Figure 5:
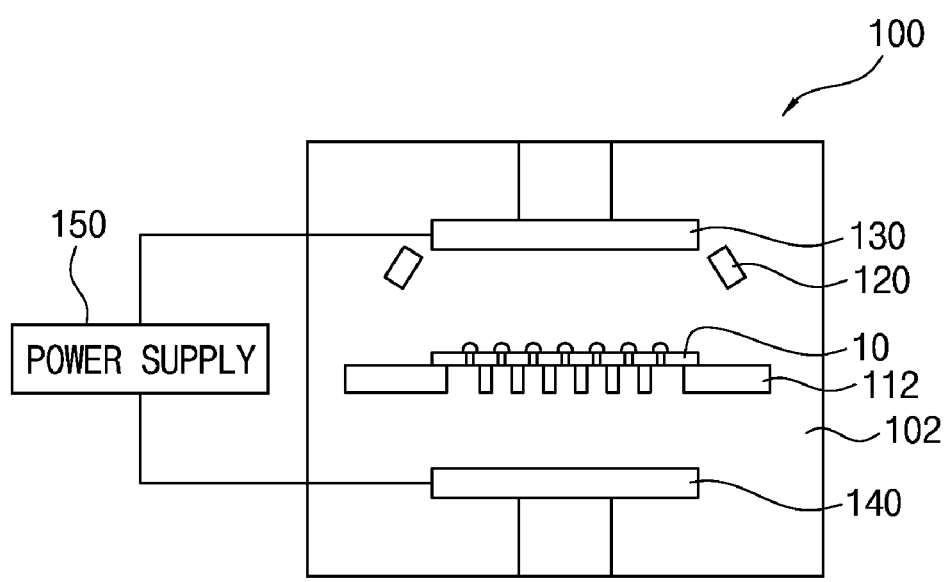
FIG. 5 is a schematic view illustrating another example of a stage as shown in FIG. 2.

FIG. 5 is a schematic view illustrating another example of the stage as shown in FIG. 2.

Referring to FIG. 5, a stage 112 may be disposed in a process chamber 102 in order to support a substrate 10. For example, the stage 112 may have a mesh shape such that portions where via holes 12 are formed are exposed downward. As a result, air inside the via holes 12 may be exhausted downward through the stage 112 while the via holes 12 are filled with a filling material 20.

Figure 6:
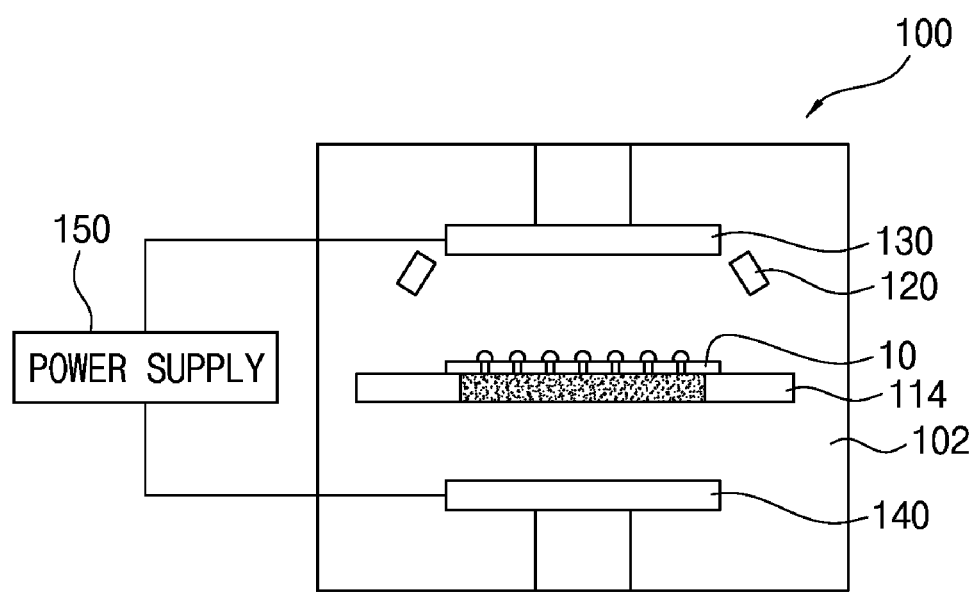
FIG. 6 is a schematic view illustrating still another example of the stage as shown in FIG. 2.

FIG. 6 is a schematic view illustrating still another example of the stage as shown in FIG. 2.

Referring to FIG. 6, a stage 114 made of a porous ceramic material may be disposed in a process chamber 102.

In accordance with the exemplary embodiments of the present disclosure as described above, a filling material 20 having fluidity may be provided on via holes 12 of a substrate 10, and may then be filled in the via holes 12 by an electric field through the substrate 10. For example, an AC voltage may be applied to upper and lower electrodes 130 and 140 disposed on upper and lower sides of the substrate 10, respectively. Thus, an electromotive force may be alternately applied to the filling material 20 in a vertical direction, and the filling material 20 may be filled in the via holes 12 by the alternating electromotive force.

Particularly, voids may be prevented from being generated in the via holes 12 due to vertical vibration caused by the alternating electromotive force. As a result, TSV electrodes 30 formed in the via holes 12 by using the via hole filling method may have relatively low electrical resistance and improved conductivity.

Further, the amount of the filling material 20 provided on the via holes 12 may be appropriately adjusted so that no residues are left on front and rear surfaces of the substrate 10. Thus, there is no need to remove the residues from the substrate 10 after the TSV electrodes 30 are formed, thereby reducing the cost and time required to form the TSV electrodes 30.

Although the method and apparatus for filling via holes have been described with reference to specific embodiments, they are not limited thereto. Therefore, it will be readily understood by those skilled in the art that various modifications and changes can be made thereto without departing from the spirit and scope of the present disclosure defined by the appended claims.

The invention claimed is:

1. An apparatus for filling a via hole, the apparatus comprising:
    a stage for supporting a substrate having a via hole, which is formed through the substrate;
    an upper electrode disposed to be spaced upward from the stage;
    a lower electrode disposed to be spaced downward from the stage; and
    a power supply connected with the upper and lower electrodes to form an electric field through the substrate,
    wherein a filling material, which is provided on the via hole and has a fluidity, is filled in the via hole by the electric field,
    the power supply applies a DC voltage to the upper and lower electrodes so that the filling material is moved into the via hole and then applies an AC voltage to the upper and lower electrodes so that the filling material is aligned in the via hole, and
    the stage and the upper and lower electrodes are disposed in a process chamber, and an infrared heater is disposed in the process chamber to melt the filling material provided on the via hole so that the filling material has the fluidity.

2. The apparatus of claim 1, wherein the stage has a ring shape to support an edge portion of the substrate.

3. The apparatus of claim 1, wherein the stage has a mesh shape such that a portion where the via hole is formed is exposed downward.

4. The apparatus of claim 1, wherein the stage is made of a porous ceramic material.

5. The apparatus of claim 1, wherein a distance between the upper electrode and the substrate is equal to a distance between the substrate and the lower electrode.

* * * * *